United States Patent
Lu et al.

(10) Patent No.: US 10,950,444 B2
(45) Date of Patent: Mar. 16, 2021

(54) METAL HARD MASK LAYERS FOR PROCESSING OF MICROELECTRONIC WORKPIECES

(71) Applicant: Tokyo Electron Limited, Tokyo (JP)

(72) Inventors: Yen-Tien Lu, Albany, NY (US); Kai-Hung Yu, Albany, NY (US); Andrew Metz, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/252,949

(22) Filed: Jan. 21, 2019

(65) Prior Publication Data
US 2019/0237331 A1 Aug. 1, 2019

Related U.S. Application Data

(60) Provisional application No. 62/665,107, filed on May 1, 2018, provisional application No. 62/624,031, filed on Jan. 30, 2018.

(51) Int. Cl.
| | |
|---|---|
| *H01L 21/00* | (2006.01) |
| *H01L 21/033* | (2006.01) |
| *H01L 21/768* | (2006.01) |
| *H01L 21/311* | (2006.01) |

(52) U.S. Cl.
CPC ...... *H01L 21/0338* (2013.01); *H01L 21/0332* (2013.01); *H01L 21/0335* (2013.01); *H01L 21/0337* (2013.01); *H01L 21/31116* (2013.01); *H01L 21/31144* (2013.01); *H01L 21/76816* (2013.01); *H01L 21/76877* (2013.01)

(58) Field of Classification Search
CPC .................................................. H01L 21/0337
See application file for complete search history.

(56) References Cited

U.S. PATENT DOCUMENTS

| | | | |
|---|---|---|---|
| 6,617,248 B1* | 9/2003 | Yang | C23C 16/40 |
| | | | 257/E21.018 |
| 9,346,672 B1* | 5/2016 | Zhang | G11B 5/3116 |
| 2004/0102041 A1* | 5/2004 | Okudaira | H01L 21/32139 |
| | | | 438/689 |
| 2004/0121593 A1* | 6/2004 | Matsunuma | H01L 21/32139 |
| | | | 438/671 |

(Continued)

*Primary Examiner* — Caridad Everhart
*Assistant Examiner* — Ankush K Singal
(74) *Attorney, Agent, or Firm* — Rothwell Figg, Ernst & Manbeck, P.C.

(57) ABSTRACT

Embodiments are disclosed for a method to process microelectronic workpieces including forming a metal hard mask layer including ruthenium (Ru MHM layer) over one or more underlying layers on a substrate for a microelectronic workpiece, etching the Ru MHM layer to provide a patterned Ru MHM layer, and etching the one or more underlying layers using the patterned Ru MHM layer as a mask to protect portion of the one or more underlying layers. For one embodiment, the Ru MHM layer is a material including 95 percent or more of ruthenium (Ru). For another embodiment, the Ru MHM layer is a material including 70 percent or more of ruthenium (Ru). Further, the Ru MHM layer preferably has a selectivity of 10 or greater with respect to a next underlying layer adjacent to the Ru MHM layer, such as a SiN hard mask layer.

21 Claims, 4 Drawing Sheets

(56) References Cited

U.S. PATENT DOCUMENTS

| | | | |
|---|---|---|---|
| 2006/0273366 A1* | 12/2006 | Ko | H01L 28/65 |
| | | | 257/295 |
| 2012/0248609 A1* | 10/2012 | Tomita | H01L 21/76804 |
| | | | 257/751 |
| 2015/0093903 A1* | 4/2015 | Aoyama | H01L 21/3065 |
| | | | 438/703 |
| 2018/0144976 A1* | 5/2018 | Law | H01L 21/76816 |

* cited by examiner

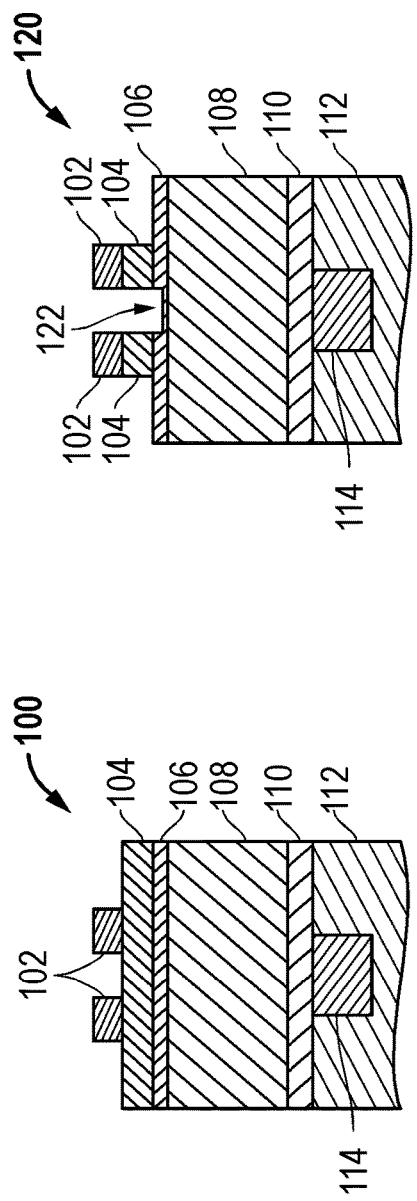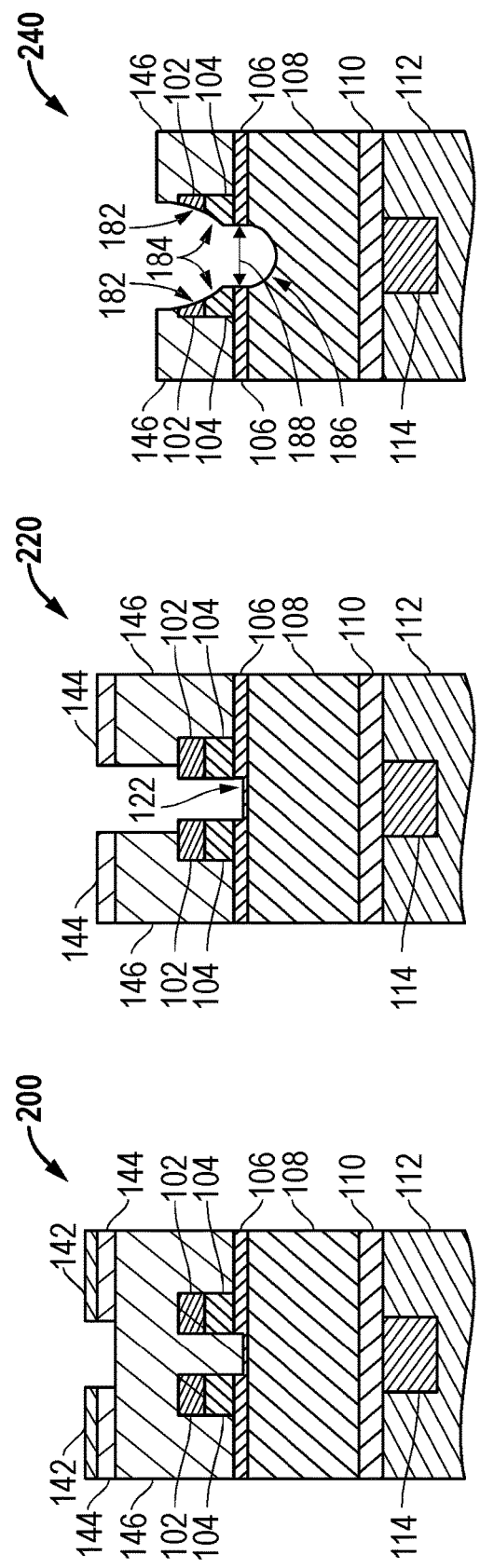

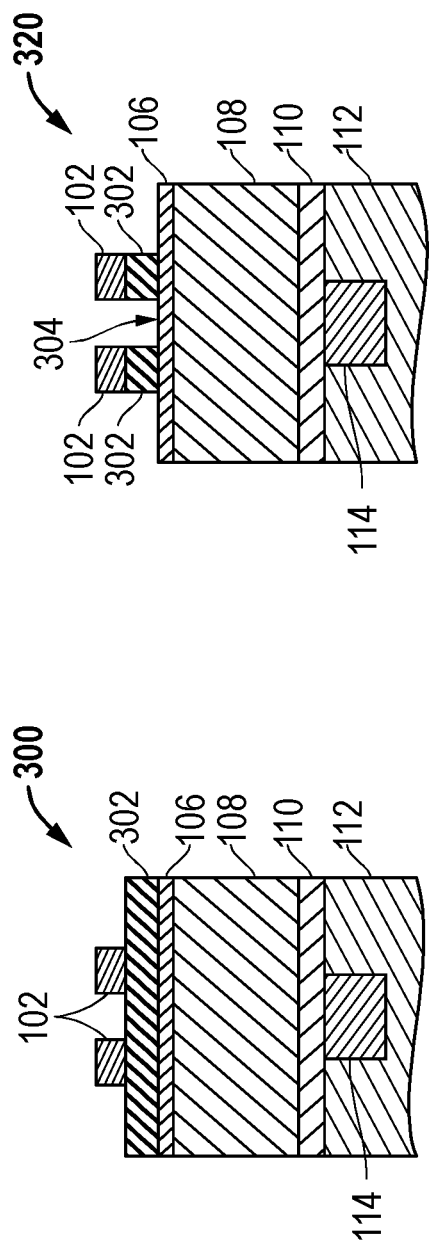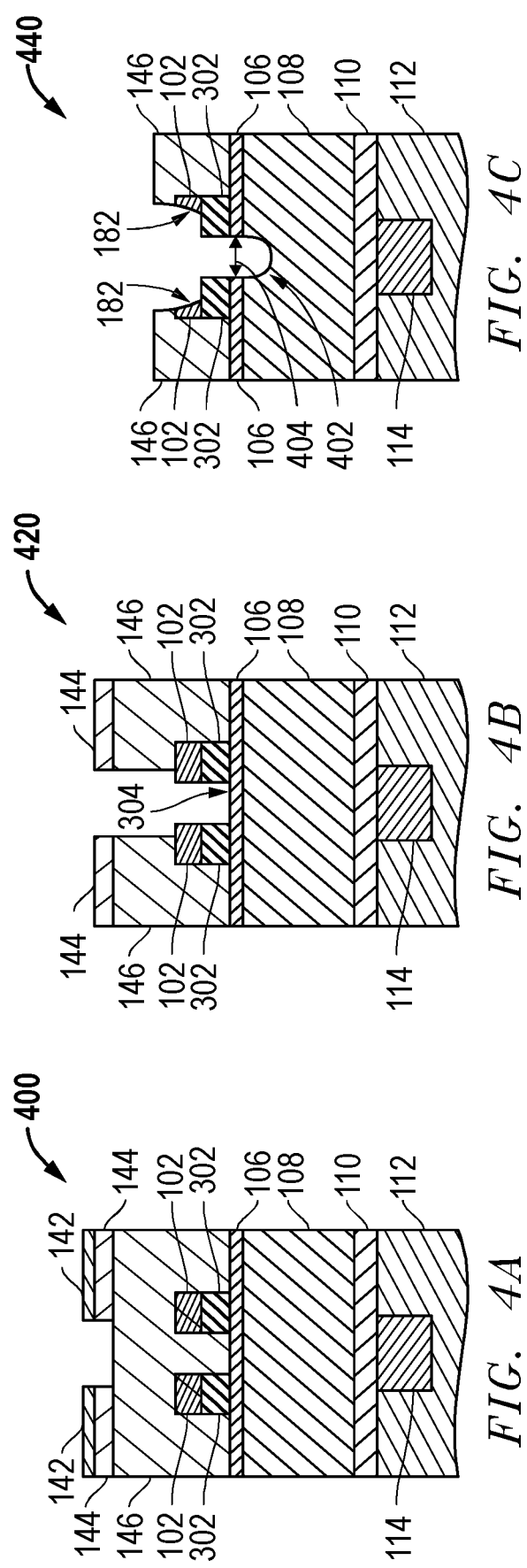

METAL HARD MASK LAYERS FOR PROCESSING OF MICROELECTRONIC WORKPIECES

RELATED APPLICATIONS

The present application claims the benefit of U.S. Provisional Patent Application No. 62/624,031, filed on Jan. 30, 2018, entitled "METAL HARD MASK LAYERS FOR PROCESSING OF MICROELECTRONIC WORKPIECES," which is incorporated herein by reference in its entirety. The present application also claims the benefit of U.S. Provisional Patent Application No. 62/665,107, filed on May 1, 2018, entitled "METAL HARD MASK LAYERS FOR PROCESSING OF MICROELECTRONIC WORKPIECES," which is incorporated herein by reference in its entirety.

BACKGROUND

The present disclosure relates to methods for processing microelectronic workpieces, and in particular, methods for creating patterned structures on the microelectronic workpieces.

Device formation within microelectronic workpieces typically involves a series of manufacturing techniques related to the formation, patterning, and removal of a number of layers of material on a substrate. To meet the physical and electrical specifications of current and next generation semiconductor devices, processing flows are being requested to reduce feature size while maintaining structure integrity for various patterning processes.

For some devices formed on microelectronic workpieces, vias are formed in one or more layers to reach conductive interconnects formed by a patterned conductive layer. Critical dimension (CD) for this via formation, such as using a BEOL (back end of line) etch process, typically needs to be precisely controlled to make electronic devices function properly. If the via CD is smaller than the targeted via CD, the via will be difficult to fill with a metal or conductive material during a metallization process step. Further, the resistance of metal interconnects formed in these smaller vias will increase because of the smaller metal cross-section area and its effect on electrical properties. If the via CD is larger than the targeted via CD, a short circuit might occur between two adjacent metal interconnects after the metallization, and this short circuit will likely lead to failure of the electronic device.

To facilitate the formation of vias within patterned structures for a microelectronic workpiece, prior process solutions have used metal hard mask (MHM) layers and hard mask (HM) layers as patterned masks to cover portions of underlying layers that are not to be etched. For example, TiN has been used as a material for MHM layers as it has a higher resistance to etching as compared to typical materials used for HM layers such as SiN, $SiO_2$, SiON, or other similar materials. For these prior process solutions, the MHM layer is formed on top of the HM layer to better control the via CD during an etch process to form patterned structures (e.g., BEOL etch to form dual damascene structures). However, a TiN MHM layer is still subject to being etched during the etch process to open the SiN HM layer for formation of patterned structures including via formation. This undesired etching of the TiN MHM layer can cause a via CD that is larger than the target via CD and can cause poor LCDU (local critical dimension uniformity).

Prior solutions typically use TiN as a MHM layer that is formed over a SiN HM layer. However, when the TiN MHM layer is opened in a via open step so that a via can also be opened in the SiN HM layer, the typical chemistries used for this etch (e.g., etch chemistries including $Cl_2$ and Ar) will also etch the SiN HM layer and form gouging into the SiN HM layer as shown in FIGS. 1A-B (Prior Art). Further, the level of gouging typically varies at different locations, for example, due to variations in etch processes such as variations in RIE (reactive ion etch) lag. A denser pattern usually has a lower gouging level, and a less dense pattern usually has a higher gouging level. The different gouging levels will also cause different via CDs to form after etch step used to etch underlying layers, such as etch steps for a HM layer, a ULK (ultra-low dielectric constant (k)) layer, a Blok (barrier low dielectric (k)) layer, and/or other layers. Eventually, the final via CD for the contact vias to an underlying conductive layer, such as a metal (M) layer, will be significantly different from each other.

Looking now to FIG. 1A (Prior Art), an embodiment 100 is shown for multiple layers that have been formed on a microelectronic workpiece including a TiN layer 104 as a MHM layer and a SiN layer 106 as a HM layer. Other layers underlying these two layers 104/106 include a dielectric layer 108 such as a ULK layer, a Blok layer 110, and an additional dielectric layer 112. A conductive region 114, such as a metal (M) conductive region, has been formed within the dielectric layer 112. An oxide ($SiO_2$) layer 102 has been formed and patterned over the TiN layer 104 as part of a MHM open process.

FIG. 1B (Prior Art) is an example embodiment 120 after an etch process has been used to remove portions of the TiN MHM layer 104 in order to open a via within the TiN MHM layer 104 vertically above the conductive region 114. This via within the TiN MHM layer 104 extends down to the SiN layer 106. However, the etch process for this via formation can leave a gouge 122 within the underlying SiN layer 106 as indicated above, and this gouge 122 causes the SiN layer 106 to be thinner than for other vias formed across a substrate for a microelectronic workpiece. Further, the amount of gouging can vary across the different vias, for example, due to variations in the etch process such as variations in RIE lag.

Another issue with this use of TiN as a MHM material in prior solutions is that the TiN MHM layer is often eroded during subsequent etch process steps for underlying layers, such as etches to a HM layer, a ULK layer, a Blok layer, and/or other underlying layers. As described herein, the chemistries used for opening these layers also tend to etch the TiN MHM layer. For example, a lateral etch can occur into the TiN MHM layer, and the top part of TiN MHM layer can also be consumed during these etches of underlying layers, as shown in FIGS. 2A-C. This undesired etching will cause the via CD to be larger than the targeted CD value. An undesired larger CD value can in turn generate short circuits with respect to the metal (M) contacts and/or cause more distorted via profiles in underlying layers (e.g., an ULK layer). Further, TiN residue will typically be generated during the via and trench etch steps from this lateral etching of the TiN MEM layer, and this residue can adversely affect the yield associated with the via opening processes and resulting electronic devices formed on the microelectronic workpiece.

Looking now to FIG. 2A (Prior Art), an embodiment 200 is shown for multiple layers that have been formed on a microelectronic workpiece. As with FIGS. 1A-B (Prior Art), the multiple layers include a TiN layer 104 as a MHM layer that has been formed over a SiN layer 106 as a HM layer. Other layers include a dielectric layer 108 such as a ULK layer, a Blok layer 110, and a dielectric layer 112. In addition, an OPL (organic planarization layer) layer 146 has been formed over the structures shown in FIG. 1B (Prior Art) as a protection layer, and a silicon ARC (anti-reflective coating) layer 144 and a PR (photoresist) layer 142 have been formed and patterned over the OPL layer 146.

FIG. 2B (Prior Art) is an example embodiment 220 after an etch process has been used to open a via within the OPL layer 146 vertically above the conductive region 114 down to the SiN layer 106. This via formation exposes the gouge 122 within the underlying SiN layer 106.

FIG. 2C (Prior Art) is an example embodiment 240 after a further etch process has been used to remove the SiN layer 106 within the via formed over the conductive region 114. The TiN layer 104 that is used as the MHM layer is often eroded as part of this further etch process. This erosion 184 in the TiN MHM layer 104, and similar erosion 182 in the oxide layer 102, leads to a larger critical dimension (CD) 188 for the via than the desired target CD. Further, the gouging 122 within the SiN layer 106 will also cause gouging 186 within the dielectric layer 112. Further, differences in the level of gouging 122 within the SiN layer 106 for different vias across a substrate will also cause different levels of gouging 186 within the dielectric layer 112 for these different vias. Ultimately, the CD variations and gouging variations lead to undesirable variations in the CD for vias that are later formed down to the conductive region 114, and these undesirable variations can lead to defects and performance issues in the final electronic devices formed within the microelectronic workpiece being manufactured.

SUMMARY

Embodiments are described herein that use a new material for metal hard mask (MHM) layers to better control critical dimension (CD) in the formation of patterned structures including via formation to underlying layers, such as underlying patterned conductive layers. This new material is ruthenium (Ru), and an Ru MHM layer can be implemented using Ru and/or a material containing ruthenium (Ru) that has properties similar to ruthenium (Ru) with respect to the process steps described herein. Further, other metals or metal containing materials can also be used that have properties similar to ruthenium (Ru) with respect to the process steps described herein. In one embodiment, an Ru MHM layer can be used to replace a TiN MEM layer as a patterned mask layer to protect portions of underlying layers during an etch process, such as an etch process to form vias through underlying layers, for the manufacture of microelectronic workpieces. Different or additional features, variations, and embodiments can also be implemented, and related systems and methods can be utilized as well.

For one embodiment, a method of processing microelectronic workpieces is disclosed including forming a metal hard mask layer including ruthenium (Ru MHM layer) over one or more underlying layers on a substrate where the substrate is part of a microelectronic workpiece, etching the Ru MHM layer to provide a patterned Ru MHM layer, and etching the one or more underlying layers using the patterned Ru MHM layer as a mask to protect portions of the one or more underlying layers.

In additional embodiments, the Ru MHM layer is a material including 95 percent or more of ruthenium (Ru). In further embodiments, the Ru MHM layer is a material including 70 percent or more of ruthenium (Ru).

In additional embodiments, the Ru MHM layer has a selectivity of 10 or greater with respect to a next underlying layer adjacent to the Ru MHM layer. In further embodiments, the next underlying layer includes a SiN layer. In still further embodiments, the Ru MHM layer has a selectivity of 5 or greater with respect to a next underlying layer adjacent to the Ru MHM layer.

In additional embodiments, the etching of the Ru MHM layer includes performing a plasma etch process using a plasma including O2 and Cl2. In further embodiments, the etching of the one or more underlying layers includes performing a plasma etch process using a plasma including N2, Ar, and CF4. In still further embodiments, the one or more underlying layers include an ultra-low dielectric constant (ULK) layer.

In additional embodiments, the etching of the one or more underlying layers includes forming vias. In further embodiments, the forming and etching are controlled to ensure that critical dimension (CD) target parameters are met for the vias. In further embodiments, the vias are formed to reach a patterned conductive layer. In still further embodiments, the method also includes performing one or more metallization steps to fill the vias.

In additional embodiments, the one or more underlying layers include a hard mask (HM) layer. In further embodiments, the Ru MHM layer is formed on top of the HM layer. In still further embodiments, the HM layer includes at least one of SiN, SiO2, or SiON.

In additional embodiments, a protection layer is formed over the patterned Ru MHM layer. In further embodiments, the protection layer includes an organic planarization layer (OPL).

In additional embodiments, the forming of the Ru MHM layer includes one or more deposition steps. In further embodiments, the one or more deposition steps includes a plasma deposition step.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIGS. 1A-B (Prior Art) provide example embodiments for a traditional process flow for where an opening is formed within a MHM layer to reach a HM layer.

FIGS. 2A-C (Prior Art) provide example embodiments for a traditional process flow for where a via is formed into a layer underlying a MHM layer and a HM layer causing lateral erosion of the MHM layer.

FIGS. 3A-B provide example embodiments for a process flow where ruthenium (Ru) or a material including Ru is used as a MHM layer during formation of an opening within the MEM layer to reach a HM layer.

FIGS. 4A-C provide example embodiments for a process flow where Ru or a material including Ru is used as a MHM layer during formation of a via through the MHM layer and a HM layer into underlying layers.

DETAILED DESCRIPTION

Figure 5:
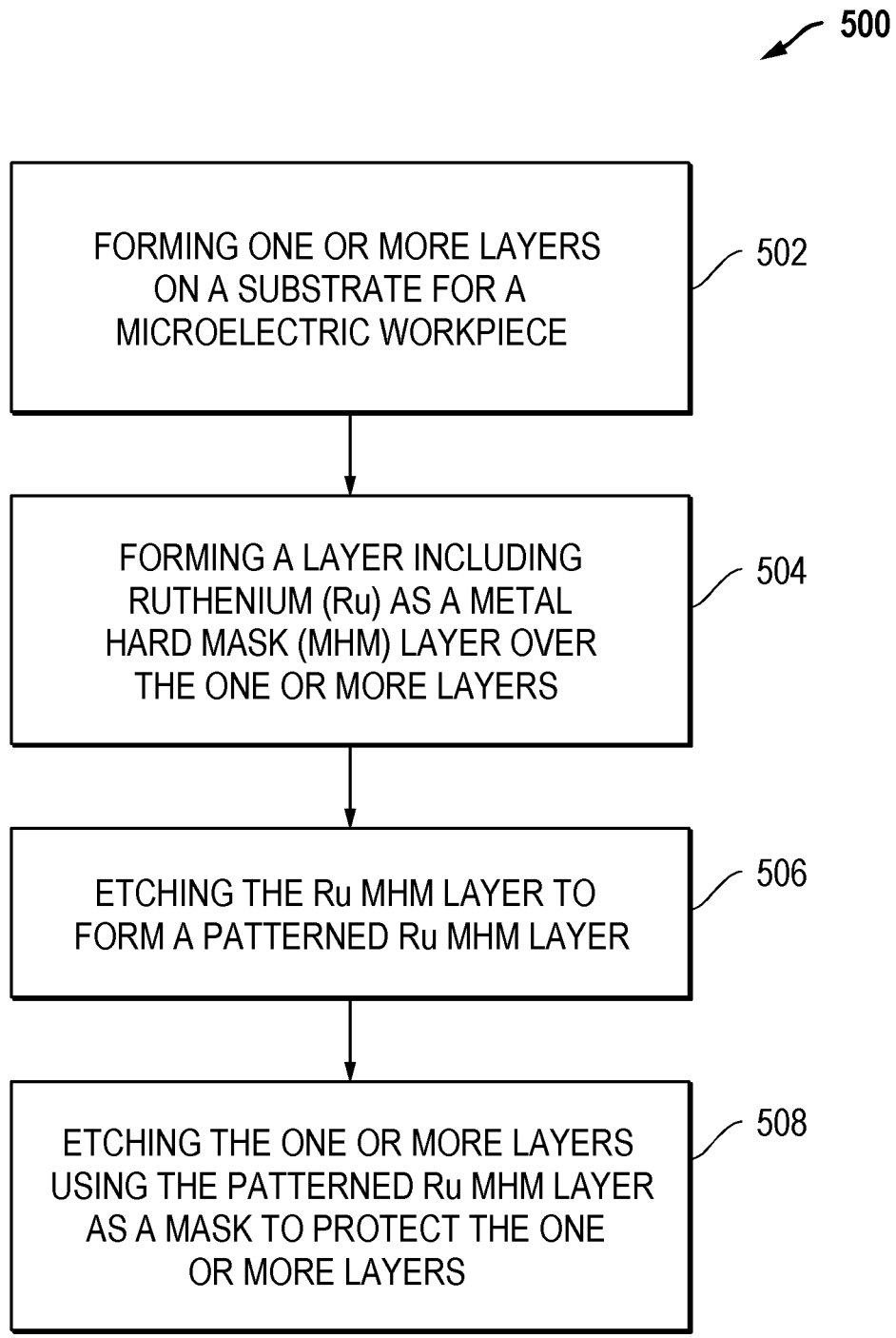
FIG. 5 is a process diagram of an example embodiment that where Ru or a material including Ru is used as a mask layer to protect one or more underlying layers.

To better control the via critical dimension (CD) in underlying layers (e.g., an ultra-low dielectric constant (ULK) layer), the embodiments disclosed herein introduce ruthenium (Ru) as a new material for a metal hard mask (MHM) layer deposited on one or more underlying layers of a substrate, such as conventional hard mask (HM) layers including SiN, $SiO_2$, SiON, or similar materials. An Ru MHM layer can be implemented using Ru and/or a material containing Ru that has properties similar to ruthenium (Ru) with respect to the process steps described herein. The Ru MHM layer has a higher etch resistance compared to conventional TiN MHM layers because Ru is not etched or is insignificantly etched by typical etch chemistries (e.g., $N_2$, Ar, and $CF_4$ plasma chemistries) used for etching typical layers underlying the HM layer. Such typical underlying layers include ULK layers and Blok layers. Ru is only etched effectively, for example, using $O_2$ with $Cl_2$ chemistries to form $RuO_4$. Thus, Ru is not eroded during standard etch processes, such as standard BEOL etch processes, and the Ru MHM layers will keep their original profile and thickness. This lack of erosion using Ru MHM layers allows for better control of CD in the formation of patterned structures such as vias.

The Ru MHM layer techniques described herein can be applied to current etch processes, such as a BEOL integration flow. The disclosed embodiments also effectively address issues of via CD distortions and RIE lag experienced where deposition-etch-combined solutions are used instead of etch-only solutions. The Ru MHM layers can be removed ex-situ by wet cleaning or surface etching and cleaning. Further, Ru layers can also be removed in-situ in the same etch chamber used for via formation with Ru etch chemistries.

In contrast with prior solutions, the embodiments described herein that use an Ru MHM layer provide significant advantages over prior MHM solutions. Because the Ru MHM layer is only etched effectively by $O_2$ with $Cl_2$ and these chemistries have higher selectivity to typical hard mask layers (e.g., hard mask layers using SiN, $SiO_2$, SiON, or similar materials) for the HM layer, the etch process steps used to open vias within the Ru MHM layer can better stop on the underlying HM layer without gouging into this underlying HM layer. As shown in FIGS. 3A-B, therefore, very little, if any, gouging will occur into the HM layer, and the RIE lag issue experienced in prior solutions for following etch steps can be more effectively suppressed. Further, the high etch resistance of the Ru MHM layer allows the Ru MHM layer not to be eroded during following etch steps for additional underlying layers (e.g., ULK layer, Blok layer, and/or other underlying layers).

As recognized in the disclosed embodiments, therefore, Ru provides an advantageous material to use as a MHM layer in order to keep the via CD at a desired or target parameter as shown in FIGS. 4A-C. The yield of via opening processes will also be more stable because there is no Ru impurity generated in the via during the via formation and trench etch processes.

Advantages of the disclosed embodiments that use Ru MHM layers include, but are not limited to, the following: (1) effectively eliminate RIE lag (e.g., little to no gouging in the HM layer which can include SiN, $SiO_2$, SiON, or other similar material; (2) better control of via CD (e.g., no erosion of Ru MHM layer during the via and trench etch steps); (3) help to ensure the yield of via opening processes (e.g., no Ru residue generated during the via formation and trench etch steps); and (4) expand the applications of Ru deposition chambers (e.g., increased use of Ru deposition tools for formation of Ru MHM layers).

Looking back to FIGS. 3A-B and FIGS. 4A-C, process steps are shown for formation of vias where an Ru MHM layer is used to protect underlying layers and improve CD control.

For one disclosed embodiment, an Ru layer is formed as a MHM layer over a HM layer, such as a SiN HM layer. For one embodiment, the Ru layer is formed using one or more depositions steps including a plasma deposition process step. An $SiO_2$ layer can also be formed and opened to expose portions of the Ru MHM layer over the SiN HM layer. The Ru layer is etched, for example by $O_2$ plasma with $Cl_2$, without gouging into the SiN HM layer as shown in FIGS. 3A-B. After Ru opening to form patterns in the Ru MHM layer using one or more etch process steps, additional layers can be deposited. As shown in FIGS. 4A-C, these layers can include an OPL layer as a protection layer, a silicon ARC layer (SiARC), and a PR layer, for example, that are deposited by spin-on coating on top of the Ru MHM layer and the SiN HM layer.

Once the PR layer has been developed, the SiARC layer and the OPL are etched to form vias to the SiN HM layer. When the SiN HM layer is etched to form a via to a layer under the SiN HM layer, this underlying layer (e.g., ULK layer) may be gouged and the $SiO_2$ layer above the Ru MHM layer may be eroded as shown in FIGS. 4A-C. However, in contrast with prior solutions that use a TiN MHM layer, the Ru MHM layer is not eroded as also shown in FIGS. 4A-C. This lack of erosion in the Ru MHM layer allows for more precise control of the via CD and other advantages as described herein.

Layers underlying the SiN HM layer can also be etched. For example, the ULK layer can be opened to form vias to underlying layers such as a Blok layer. Further, the via formation is either stopped at the underlying layer (e.g., Blok layer) or is allowed to gouge into that layer. After that, intervening layers (e.g., the OPL) can be removed (e.g., an ash step) so that the HM layer and the MHM layer can be exposed.

For the embodiment shown in FIGS. 4A-C, further via etch process steps can be included before the OPL ash step. For example, the exposed portion of the SiN HM layer can be etched away to reveal the underneath ULK layer. After removal of this exposed portion of the SiN HM layer, the ULK layer can be etched for the desired via height. The underlying Blok layer can also be fully opened during the etch of the SiN HM layer and the ULK layer. If not, an extra Blok etching step can also be used to completely open the via through the Blok layer to the underlying patterned conductive layer (e.g., metal layer).

Once the via formation has been completed, for example, where the via lands on a metal (M) layer or other conductive layer, a post etch treatment (PET) can be used for residue removal from the via bottom and sidewall. After the PET step, the remaining parts of the HM layer and the MHM layer are removed by either ex-situ or in-situ methods. The microelectronic workpiece can also be continuously processed for the later metal filling within the vias that were formed. One or more metallization process steps can be used to provide this metal filling within the vias. Other variations could also be implemented.

Looking now to FIG. 3A, an embodiment 300 is shown for multiple layers that have been formed on a microelectronic workpiece including an Ru layer 302 as a MHM layer that has been formed over a SiN layer 106 as a HM layer. The multiple layers also include a dielectric layer 108 such as an ultra-low dielectric (k) layer, a Blok (barrier low dielectric (k)) layer 110, and a dielectric layer 112. A conductive region 114, such as a metal (M) conductive region, has been formed within the dielectric layer 112. An oxide ($SiO_2$) layer 102 has been formed and patterned over the Ru MHM layer 302 as part of a HM open process.

FIG. 3B is an example embodiment 320 after an etch process has been used to remove portions of the Ru MHM layer 302 and to open a via within the Ru MHM layer 302 above the conductive region 114 down to the SiN layer 106. Unlike prior solutions, this via formation through the Ru MHM layer 302 does not leave a gouged area because the Ru MHM layer has higher selectivity to the SiN layer 106. The region 304 across multiple vias remain at the same level. Further, the Ru MHM layer 302 can be etched by oxygen-based etch recipes.

Looking now to FIG. 4A, an embodiment 400 is shown for multiple layers that have been formed on a microelectronic workpiece. As with FIGS. 3A-B, the multiple layers include an Ru layer 302 as a MHM layer that has been formed over a SiN layer 106 as a HM layer. The layers also include a dielectric layer 108 such as an ultra-low dielectric (k) layer, a Blok (barrier low dielectric (k)) layer 110, and a dielectric layer 112. In addition, an OPL layer 146 has been formed over the structures shown in FIG. 3B as a protection layer, and a silicon ARC layer 144 and a PR layer 142 have been formed and patterned over the OPL layer 146.

FIG. 4B is an example embodiment 420 after an etch process has been used to open a via within the OPL layer 146 above the conductive region 114 down to the SiN layer 106. This via formation exposes the region 304 to the underlying SiN layer 106.

FIG. 4C is an example embodiment 440 after a further etch process has been used to remove the SiN layer 106 within the via formed over the conductive region 114. In contrast with prior solutions, the Ru MHM layer 302 is not eroded as part of this further etch process. Even though there is still erosion 182 in the oxide layer 102, the lack of erosion in the Ru MHM layer 302 leads to improved control of the critical dimension (CD) 404 for vias formed through SiN layer 106. Further, gouging 402 within the dielectric layer 108 can be better controlled or eliminated, and any gouging 402 will also be more consistent with respect to different vias across the substrate for the microelectronic workpiece. This consistency leads to consistent CD for vias that are later formed down to the conductive region 114, thereby improving performance of final electronic devices formed within the microelectronic workpiece being manufactured.

FIG. 5 is a process diagram of an example embodiment 500 where a material layer including Ru is formed and used as a MHM layer to protect one or more underlying layers during an etch process. In block 502, one or more layers are formed on a substrate for a microelectronic workpiece. In block 504, a layer including Ru is formed over the one or more layers as a MHM layer. In block 506, the Ru MHM layer is etched to form a patterned Ru MHM layer over one or more layers that lie under the patterned Ru MHM layer. In block 508, the one or more underlying layers are then etched using the patterned Ru MHM layer as a mask to protect the one or more underlying layers during the further etch process. The Ru MHM layer is particularly useful where the underlying layer is an SiN layer because the Ru MHM layer has an improved selectivity to the SiN layer that allows for reduction or elimination of gouging and related variations within the SiN layer with respect to vias formed through the Ru MHM layer.

With respect to the Ru MHM layer, the layer can be made from Ru or can be made from a material containing Ru. For one example embodiment, the Ru MHM layer is a material including 95 percent or more of Ru. For another example embodiment, the Ru MHM layer is a material including 70 percent or more of ruthenium (Ru). Further, the Ru MHM layer for the embodiments described herein preferably has a selectivity to the next underlying layer of at least 10 or greater. As such, the etch rate with respect to the Ru MHM layer will be at least 10 times or greater than the etch rate for the next underlying layer for a selected etch chemistry and process. As one example, the etch rate for the Ru MHM layer is at least 10 times or greater than a HM layer that is the next underlying adjacent to the Ru MHM layer. For other embodiments, the Ru MHM layer has a selectivity to the next underlying layer of at least 5 or greater with respect to one or more underlying layers. As one further example, a SiN HM layer is used as the next underlying adjacent layer, and $O_2$ etch chemistries are used, such as $O_2$ with $Cl_2$ etch chemistries. Other variations can also be implemented.

Although the embodiments described above focus on an Ru MHM layer, other metal materials that will provide the advantages listed above can also be used to implement the MHM layer instead of the materials used in prior solutions (e.g., TiN).

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to PR layers can be implemented using optical lithography, extreme ultraviolet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that CD target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

Figure 6:
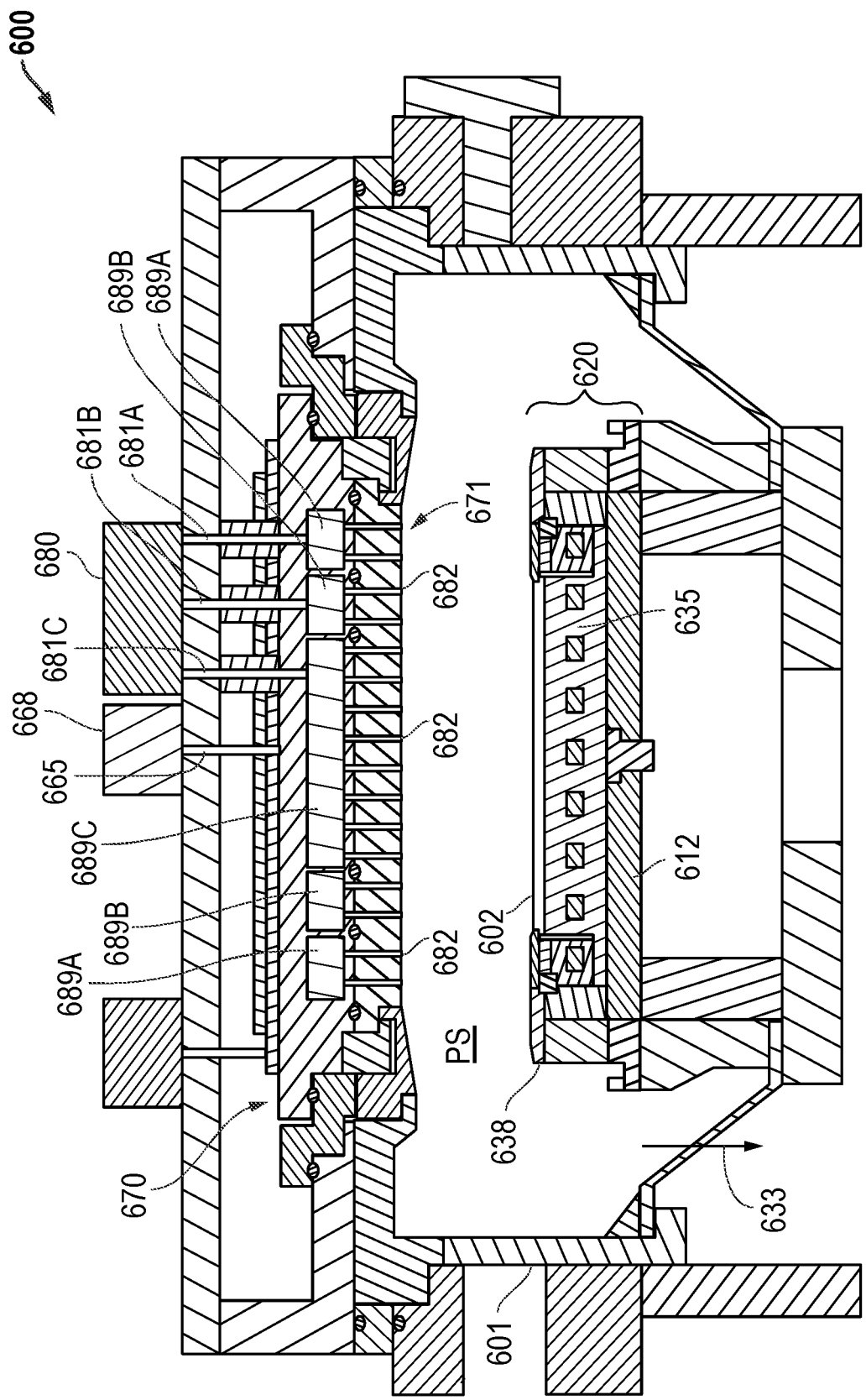
FIG. 6 is a block diagram of an example embodiment for a workpiece manufacturing system, such as a plasma processing apparatus, that can be used as a processing chamber for the embodiments described herein.

An embodiment 600 for an example plasma etch processing system is described with respect to FIG. 6. It is noted, however, that the techniques described herein may be utilized with a wide range of etch processing systems, and the embodiment 600 is simply one example embodiment.

FIG. 6 is a block diagram of an example embodiment 600 for a workpiece manufacturing system, such as a plasma processing apparatus, that can be used as an etch chamber for the embodiments described herein. More particularly, FIG. 6 illustrates one example embodiment for a plasma processing apparatus merely for illustrative purposes that can be used to implement the processing techniques described herein. It will be recognized that other plasma process systems and other etch process systems may equally implement the techniques described herein. For the example embodiment 600 of FIG. 6, a schematic cross-sectional view is provided for a capacitively coupled plasma processing apparatus including a process space (PS) that provides an etch chamber for microelectronic workpieces. Alternative plasma process apparatus may also be utilized, including for example, but not limited to, inductively coupled plasma processing apparatus, microwave plasma processing apparatus, and the like. A capacitively coupled plasma processing apparatus may be particularly well suited as the electrode spacing of such apparatus allow beneficial control of gases to a localized region of the plasma space, thus providing localized plasma processing on the substrate.

The plasma processing apparatus 600 can be used for multiple operations including ashing, etching, deposition, cleaning, plasma polymerization, plasma-enhanced chemical vapor deposition (PECVD), atomic layer deposition (ALD) and so forth. The structure of a plasma processing apparatus 600 is well known, and the particular structure provided herein is merely exemplary. Plasma processing can be executed within processing chamber 601, which can be a vacuum chamber made of a metal such as aluminum or stainless steel. The processing chamber 601 defines a processing vessel providing a process space (PS) for plasma generation. An inner wall of the processing vessel can be coated with alumina, yttria, or other protectant. The processing vessel can be cylindrical in shape or have other geometric configurations.

At a lower, central area within the processing chamber 601, a susceptor 612 (which can be disc-shaped) can serve as a mounting table on which, for example, a substrate 602 to be processed (such as a semiconductor wafer) can be mounted. Substrate 602 can be moved into the processing chamber 601 through a loading/unloading port and gate valve. Susceptor 612 forms part of a lower electrode assembly 620 as an example of a second electrode acting as a mounting table for mounting substrate 602 thereon. The susceptor 612 can be formed of, e.g., an aluminum alloy. Susceptor 612 is provided thereon with an electrostatic chuck (as part of the lower electrode assembly) for holding the substrate 602. The electrostatic chuck is provided with an electrode 635. Electrode 635 is electrically connected to direct current (DC) power source, not shown. The electrostatic chuck attracts the substrate 602 thereto via an electrostatic force generated when DC voltage from the DC power source is applied to the electrode 635. The susceptor 612 can be electrically connected with a high-frequency power source via a matching unit. For other embodiments and processing chambers, two or more power sources can be used and connected to electrode 635 and/or other electrodes within the processing chambers. This high-frequency power source (a second power source) can output a high-frequency voltage in a range from, for example, 2 MHz (megahertz) to 20 MHz. Applying high frequency bias power causes ions, in plasma generated in the processing chamber 601, to be attracted to substrate 602. A focus ring assembly 638 is provided on an upper surface of the susceptor 612 to surround the electrostatic chuck.

An exhaust path 633 can be formed through one or more exhaust ports (not shown) which connect to a gas exhaust unit. The gas exhaust unit can include a vacuum pump such as a turbo molecular pump configured to pump out the plasma processing space within the processing chamber 601 to a desired vacuum condition. The gas exhaust unit evacuates the inside of the processing chamber 601 thereby depressurizing the inner pressure thereof down to the desired degree of vacuum.

An upper electrode assembly 670 is an example of a first electrode and is positioned vertically above the lower electrode assembly 620 to face the lower electrode assembly 620 in parallel. The plasma generation space or process space (PS) is defined between the lower electrode assembly 620 and the upper electrode assembly 670. The upper electrode assembly 670 includes an inner upper electrode 671, having a disk shape, and an outer upper electrode which may be annular and surrounding a periphery of the inner upper electrode 671. The inner upper electrode 671 also functions as a processing gas inlet for injecting a specific amount of processing gas into the process space (PS) above substrate 602 mounted on the lower electrode assembly 620. The upper electrode assembly 670 thereby forms a showerhead. More specifically, the inner upper electrode 671 includes gas injection openings 682.

The upper electrode assembly 670 may include one or more buffer chamber(s) 689A, 689B, and 689C. The buffer chambers are used for diffusing process gas and can define a disk-shaped space. Processing gas from a process gas supply system 680 supplies gas to the upper electrode assembly 670. The process gas supply system 680 can be configured to supply a processing gas for performing specific processes, such as film-forming, etching, and the like, on the substrate 602. The process gas supply system 680 is connected to gas supply lines 681A, 681B, and 681C forming a processing gas supply path. The gas supply lines are connected to the buffer chambers of the inner upper electrode 671. The processing gas can then move from the buffer chambers to the gas injection openings 682 at a lower surface thereof. A flow rate of processing gas introduced into the buffer chambers 689A-C can be adjusted by, e.g., by using a mass flow controller. Further, the processing gas introduced is discharged from the gas injection openings 682 of the electrode plate (showerhead electrode) to the process space (PS). The inner upper electrode 671 functions in part to provide a showerhead electrode assembly.

As shown in FIG. 6, three buffer chambers 689A, 689B, and 689C are provided corresponding to edge buffer chamber 689A, middle buffer chamber 689B, and center buffer chamber 689C. Similarly, gas supply lines 681A, 681B, and 681C may be configured as edge gas supply line 681A, middle gas supply line 681B and center gas supply line 681C. The buffer chambers are provided in a manner corresponding to different localized regions of the substrate in this case edge, middle and center. As will be discussed more below, these regions may correspond to specific process plasma process conditions for localized regions of the substrate 602. It will be recognized that the use of three localized regions is merely exemplary. Thus, the plasma processing apparatus may be configured to provide localized plasma process conditions on any number of regions of the substrate. It is further again noted that any of a variety of configurations may be utilized, and the techniques described herein are not limited to the manner in which the process gas supply system 680 is configured to split the gas flows to the various buffer chambers.

The upper electrode assembly 670 is electrically connected with a high-frequency power source (not shown) (first high-frequency power source) via a power feeder 665 and a matching unit 668. The high-frequency power source can output a high-frequency voltage having a frequency of 40 MHz (megahertz) or higher (e.g., 60 MHz), or can output a very high frequency (VHF) voltage having a frequency of 30-300 MHz. This power source can be referred to as the main power supply as compared to a bias power supply. It is noted for certain embodiments there is no power source for the upper electrodes, and two power sources are connected to the bottom electrode. Other variations could also be implemented.

Components of the plasma processing apparatus can be connected to, and controlled by, a control unit, which in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma processing chamber with various microfabrication techniques. In operation, the plasma processing apparatus uses the upper and lower electrodes to generate a plasma in the process space (PS). This generated plasma can then be used for processing a target substrate (such as substrate 602 or any material to be processed) in various types of treatments such as plasma etching, chemical vapor deposition, treatment of semiconductor material, glass material and large panels such as thin-film solar cells, other photovoltaic cells, and organic/inorganic plates for flat panel displays, etc.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate including a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of processing microelectronic workpieces, comprising:
    forming a metal hard mask layer comprising ruthenium (ruthenium metal hard mask layer) over one or more underlying layers on a substrate, the substrate being part of a microelectronic workpiece;
    etching the ruthenium metal hard mask layer to provide a patterned ruthenium metal hard mask layer; and
    etching the one or more underlying layers using the patterned ruthenium metal hard mask layer as a mask to protect portions of the one or more underlying layers, wherein the etching of the one or more underlying layers comprises forming vias.

2. The method of claim 1, wherein the ruthenium metal hard mask layer is a material comprising 95 percent or more of ruthenium (Ru).

3. The method of claim 1, wherein the ruthenium metal hard mask layer is a material comprising 70 percent or more of ruthenium.

4. The method of claim 1, wherein the ruthenium metal hard mask layer has a selectivity of 10 or greater with respect to a next underlying layer adjacent to the ruthenium metal hard mask layer.

5. The method of claim 4, wherein the next underlying layer comprises a silicon nitride (SiN) layer.

6. The method of claim 1, wherein the ruthenium metal hard mask layer has a selectivity of 5 or greater with respect to a next underlying layer adjacent to the ruthenium metal hard mask layer.

7. The method of claim 1, wherein the etching of the ruthenium metal hard mask layer comprises performing a plasma etch process using a plasma comprising $O_2$ and $Cl_2$.

8. The method of claim 1, wherein the etching of the one or more underlying layers comprises performing a plasma etch process using a plasma comprising $N_2$, Ar, and $CF_4$.

9. The method of claim 1, wherein the one or more underlying layers comprise an ultra-low dielectric constant (ULK) layer.

10. The method of claim 1, wherein the forming and etching are controlled to ensure that critical dimension (CD) target para e et for the vias.

11. The method of claim 1, wherein the vias are formed to reach a patterned conductive layer.

12. The method of claim 11, further comprising performing one or more metallization steps to fill the vias.

13. The method of claim 1, wherein the one or more underlying layers comprise a hard mask layer.

14. The method of claim 13, wherein the ruthenium metal hard mask layer is formed on top of the hard mask layer.

15. The method of claim 14, wherein the hard mask layer comprises at least one of SiN, $SiO_2$, or SiON.

16. The method of claim 1, wherein a protection layer is formed over t patterned ruthenium metal hard mask layer.

17. The method of claim 16, wherein the protection layer comprises an organic planarization layer (OPL).

18. The method of claim 1, wherein the forming of the ruthenium metal hard mask layer comprises one or more deposition steps.

19. The method of claim 18, wherein the one or more deposition steps comprises a plasma deposition step.

20. A method of processing microelectronic workpieces, comprising:
   forming a hard mask layer over one or more underlying layers on a substrate, the substrate being part of a microelectronic workpiece, the hard mask layer comprising at least one of SiN, $SiO_2$, or SiON;
   forming a ruthenium metal hard mask layer on the hard mask layer;
   etching the ruthenium metal hard mask layer to provide a patterned ruthenium metal hard mask layer, and wherein the etching of the ruthenium metal hard mask layer exposes the hard mask layer;
   etching the hard mask layer through the patterned ruthenium metal hard mask layer to form a patterned hard mask layer;
   etching the one or more underlying layers through the patterned ruthenium metal hard mask layer and the patterned hard mask layer, the method further comprising, after etching of the ruthenium metal hard mask layer and prior to etching of the hard mask layer forming an organic planarization layer (OPL) and an antireflective coating layer (ARC) above the patterned ruthenium metal hard mask layer.

21. The method of claim 20, wherein the etching of the ruthenium metal hard mask layer comprises performing a plasma etch process using a plasma comprising of $O_2$ and $Cl_2$; and
   wherein the etching of the hard mask layer is performed with a plasma having a different chemistry than used for etching the ruthenium metal hard mask layer.

* * * * *